(12) United States Patent
Wiseman

(10) Patent No.: US 8,528,738 B2
(45) Date of Patent: Sep. 10, 2013

(54) REUSABLE RESILIENT CUSHION FOR WAFER CONTAINER

(75) Inventor: Brian Wiseman, Glencoe, MN (US)

(73) Assignee: Entegris, Inc., Billerica, MA (US)

( * ) Notice: Subject to any disclaimer, the term of this patent is extended or adjusted under 35 U.S.C. 154(b) by 347 days.

(21) Appl. No.: 12/303,789

(22) PCT Filed: Jun. 12, 2007

(86) PCT No.: PCT/US2007/070998
§ 371 (c)(1),
(2), (4) Date: Aug. 3, 2010

(87) PCT Pub. No.: WO2007/146936
PCT Pub. Date: Dec. 21, 2007

(65) Prior Publication Data
US 2010/0307957 A1    Dec. 9, 2010

Related U.S. Application Data

(60) Provisional application No. 60/813,074, filed on Jun. 13, 2006.

(51) Int. Cl.
*B65D 85/86* (2006.01)
*B65D 81/02* (2006.01)

(52) U.S. Cl.
USPC .............................. 206/711; 206/454; 206/710

(58) Field of Classification Search
USPC ................. 206/711, 710, 454, 832, 833, 712, 206/722, 723; 221/41.18
See application file for complete search history.

(56) References Cited

U.S. PATENT DOCUMENTS

| | | | |
|---|---|---|---|
| 4,718,549 A | 1/1988 | Rissotti et al. | |
| 4,721,207 A * | 1/1988 | Kikuchi | 206/307 |
| 5,228,568 A * | 7/1993 | Ogino et al. | 206/711 |
| 5,273,159 A * | 12/1993 | Gregerson | 206/711 |
| 5,555,981 A * | 9/1996 | Gregerson | 206/711 |
| 5,988,393 A | 11/1999 | Hsia et al. | |
| 6,082,540 A * | 7/2000 | Krampotich et al. | 206/445 |
| 6,364,922 B1 * | 4/2002 | Tanaka et al. | 55/385.1 |
| 6,951,284 B2 * | 10/2005 | Cheesman et al. | 206/711 |
| 7,344,031 B2 * | 3/2008 | Hasegawa et al. | 206/710 |
| 7,967,147 B2 * | 6/2011 | Mimura | 206/711 |
| 8,118,169 B2 * | 2/2012 | Hosoi et al. | 206/711 |
| 2003/0221985 A1* | 12/2003 | Yajima et al. | 206/454 |
| 2005/0161367 A1* | 7/2005 | Matsutori et al. | 206/711 |
| 2005/0218034 A1 | 10/2005 | Kawashima | |
| 2006/0042998 A1* | 3/2006 | Haggard et al. | 206/711 |
| 2006/0283774 A1* | 12/2006 | Hasegawa et al. | 206/725 |
| 2009/0206001 A1* | 8/2009 | Sasaki et al. | 206/711 |
| 2010/0025288 A1* | 2/2010 | Lin et al. | 206/711 |
| 2010/0108565 A1* | 5/2010 | Lu et al. | 206/711 |
| 2010/0258475 A1* | 10/2010 | Ogawa | 206/711 |
| 2010/0282638 A1* | 11/2010 | Chiu et al. | 206/710 |
| 2011/0297579 A1* | 12/2011 | Lu et al. | 206/711 |

FOREIGN PATENT DOCUMENTS

| | | |
|---|---|---|
| JP | 11-121601 | 4/1999 |
| JP | 2005-294386 | 10/2005 |
| JP | 2006-066911 | 3/2006 |

* cited by examiner

*Primary Examiner* — Steven A. Reynolds
(74) *Attorney, Agent, or Firm* — Christopher Fonder P.A.

(57) ABSTRACT

A container for holding a plurality of substrates includes an enclosure portion defining an interior space. The enclosure has a pluralit of slots for receiving the substrates, and a door (26) for sealingly closing an open side A cushion (62) is received on the door.

14 Claims, 5 Drawing Sheets

REUSABLE RESILIENT CUSHION FOR WAFER CONTAINER

RELATED APPLICATIONS

This application claims the benefit of U.S. Provisional Application No. 60/813,074 for REUSABLE RESILIENT CUSHION FOR WAFER CONTAINER, filed Jun. 13, 2006, hereby fully incorporated herein by reference.

FIELD OF THE INVENTION

This invention relates generally to containers for substrates and semiconductor wafers, and in particular to cushioning devices for wafer and substrate containers.

BACKGROUND OF THE INVENTION

In the processing of wafers into semiconductors, particularly integrated circuits, numerous steps must typically be performed and the wafers must often be transported facility to facility and internally within a facility. In recent years, semiconductor wafers have increased in size to 300 mm and more in diameter. Due to their large size, the wafers are more susceptible than ever to damage. Moreover, the density of circuits on such wafers has dramatically increased. As a result, such wafers are significantly more expensive and protecting same from contamination or breaking in transportation and processing is critical.

Specialized containers have been developed for transporting wafers. One type of container includes a separate open cassette that is received in an outer enclosure, such as the device disclosed in U.S. Pat. No. 5,782,362, hereby fully incorporated herein by reference. In this configuration, the wafers are typically received edgewise in a vertical orientation in the cassette. The cassette is, in turn, enclosed in the outer enclosure which typically includes a lower base portion and a separate upper cover or door. Another type of container, known as a horizontal wafer container, generally includes an enclosure portion with one open side. Horizontal wafer shelves are defined in the container walls, and a door is sealably finable in the open side. An example of a horizontal wafer container is disclosed in U.S. Pat. No. 6,644,477, hereby fully incorporated herein by reference. Although such containers are designed to reduce the effects of physical shock, which can damage the thin, brittle wafers, wafer containers are needed with improved shock-reducing properties.

SUMMARY OF THE INVENTION

The needs of the industry are addressed by the wafer cushion of the present invention. According to an embodiment of the invention, a container for holding a plurality of semiconductor wafers includes a cassette defining a plurality of slots, each slot for receiving a separate one of the semiconductor wafers and an enclosure adapted to receive the cassette and wafers therein. The enclosure includes a base portion and a cover portion sealably securable to the base portion. The container further includes a cushion having a mounting structure with a pair of spaced apart end members and a plurality of convex shaped elongate resilient wafer receiving structures extending therebetween. Each wafer receiving structure has a pair of opposing ends and a pair of spaced apart lips intermediate the ends. The lips define a channel for receiving an edge of one of the plurality of wafers, wherein the cushion is received on the cover portion of the enclosure and is positioned such that when the wafers are received in the cassette, the cassette is received in the base portion of the enclosure, and the cover is received on the base, the channels of the cushion are in registry with the slots of the cassette and the edge of each wafer in the cassette engages and deflects a separate one of the convex wafer receiving structures inwardly toward the cover portion. Each of the wafer receiving structures further includes a spring operably coupling one of the pair of opposing ends of the wafer receiving structure to the mounting structure, such that as the wafer receiving structure is deflected inwardly toward the cover portion, the spring is compressed to thereby enable lateral extension of the wafer receiving structure.

In certain embodiments, the cover portion defines a recess facing inwardly toward the base portion, and wherein the cushion is received in the recess. The recess may be defined between a pair of spaced apart walls of the cover portion, and each of the end members of the mounting structure may abut a separate one of the spaced apart walls.

In other embodiments, the cushion may include a second plurality of convex shaped elongate resilient wafer receiving structures and the mounting structure may include a center member disposed intermediate the end members. The first plurality of wafer receiving structures extends between one of the end members and the center member and the second plurality of wafer receiving structures extends between the other one of the end members and the center member such that each one of the first plurality of wafer receiving structures is in lateral registry with a separate one of the second plurality of wafer receiving structures. Each of the wafer receiving structures of the second plurality further includes a spring operably coupling one of the pair of opposing ends of the wafer receiving structure to the mounting structure, such that as the wafer receiving structure is deflected inwardly toward the cover portion, the spring is compressed to thereby enable lateral extension of the wafer receiving structure. The springs of the first plurality of wafer receiving structures and the springs of the second plurality of wafer receiving structures may be coupled to the center member.

In another embodiment of the invention, a container for holding a plurality of semiconductor wafers includes a cassette defining a plurality of slots, each slot for receiving a separate one of the semiconductor wafers and an enclosure adapted to receive the cassette and wafers therein. The enclosure includes a base portion and a cover portion sealably securable to the base portion. The container further includes a cushion having a mounting structure with a pair of spaced apart end members and a plurality of convex shaped elongate resilient wafer receiving structures extending therebetween. Each wafer receiving structure has a pair of opposing ends and a pair of spaced apart lips intermediate the ends. The lips define a channel for receiving an edge of one of the plurality of wafers, wherein the cushion is received on the cover portion of the enclosure and is positioned such that when the wafers are received in the cassette, the cassette is received in the base portion of the enclosure, and the cover is received on the base, the channels of the cushion are in registry with the slots of the cassette and the edge of each wafer in the cassette engages and deflects a separate one of the convex wafer receiving structures inwardly toward the cover portion. Each of the wafer receiving structures further includes means for enabling lateral extension of each wafer receiving structure when the wafer receiving structure is compressed toward the cover portion.

In certain embodiments, the means for enabling lateral extension of each wafer receiving structure when the wafer receiving structure is compressed toward the cover portion includes a plurality of springs, wherein each spring operably couples a separate one of the wafer receiving structures to the mounting structure. The cushion may further include a second plurality of convex shaped elongate resilient wafer receiving structures and the mounting structure may further include a center member disposed intermediate the end members. The first plurality of wafer receiving structures extends between one of the end members and the center member and the second plurality of wafer receiving structures extends between the other one of the end members and the center member such that each one of the first plurality of wafer receiving structures is in lateral registry with a separate one of the second plurality of wafer receiving structures. Each of the wafer receiving structures of the second plurality may include means for enabling lateral extension of each wafer receiving structure of the second plurality when the wafer receiving structure is compressed toward the cover portion. The means for enabling lateral extension of each wafer receiving structure of the second plurality when the wafer receiving structure is compressed toward the cover portion may include a second plurality of springs, each spring of the second plurality operably coupling a separate one of the wafer receiving structures of the second plurality to the mounting structure.

According to another embodiment, a container for a holding a plurality of semiconductor wafers includes an enclosure adapted to receive the wafers therein, the enclosure having a pair of opposing side walls, a top, a bottom, a back, an open front, and a door for sealingly closing the open front. The enclosure has a plurality of wafer shelves defining a plurality of slots, each for receiving a separate one of the wafers. The cushion includes a mounting structure having a pair of spaced apart end members and a plurality of convex shaped elongate resilient wafer receiving structures extending therebetween. Each wafer receiving structure has a pair of opposing ends and a pair of spaced apart lips intermediate the ends, the lips defining a channel for receiving an edge of one of the plurality of wafers. The cushion is received on the door and is positioned such that when the wafers are received in the slots and the door closes the open front, the channels of the cushion are in registry with the slots and the edge of each wafer in the slots engages and deflects a separate one of the convex wafer receiving structures inwardly toward the door. Each of the wafer receiving structures has a spring operably coupling one of the pair of opposing ends of the wafer receiving structure to the mounting structure, such that as the wafer receiving structure is deflected inwardly toward the cover portion, the spring is compressed to thereby enable lateral extension of the wafer receiving structure.

In another embodiment, a container for a holding a plurality of substrates includes an enclosure portion adapted to receive the substrates therein. The enclosure portion defines an interior space and has an open side. The enclosure further includes a plurality of shelves in the interior space defining a plurality of slots, each for receiving a separate one of the substrates, and a door for sealingly closing the open side of the enclosure portion. A cushion includes a mounting structure having pair of spaced apart end members and a plurality of convex shaped elongate resilient leaf spring structures extending therebetween. Each leaf spring structure presents a pair of opposing ends. The cushion is received on the door and is positioned such that when the substrates are received in the slots and the door closes the open side, an edge of each substrate in the slots engages and deflects a separate one of the leaf spring structures inwardly toward the door. Each of the leaf spring structures further includes a biasing element operably coupling one of the pair of opposing ends of the leaf spring structure to the mounting structure, such that as the leaf spring structure is deflected inwardly toward the cover portion, the biasing element is compressed to thereby enable lateral extension of the leaf spring structure.

A feature and advantage of embodiments of the invention is that movement of the wafers in the wafer container is inhibited by frictional contact if the edges of the wafers with the cushion.

A further feature and advantage of embodiments of the invention is that, upon removal of the door from a container portion that is fully loaded, the resilence of the flexible guide members and springs keep the wafers in place in the container. This may inhibit sticking of the wafers to the cushion and eliminates the potentially catastrophic result of the wafers following the door or lid as the door or lid is being removed.

A further feature and advantage of embodiments of the invention is that the incidence of wafer breakage may be reduced and door closure force may be lowered.

A feature and advantage of embodiments of the wafer restraint system as disclosed herein may be that the wafer cushion may be positioned in a wafer carrier and then removed and reused.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENT

Figure 1:
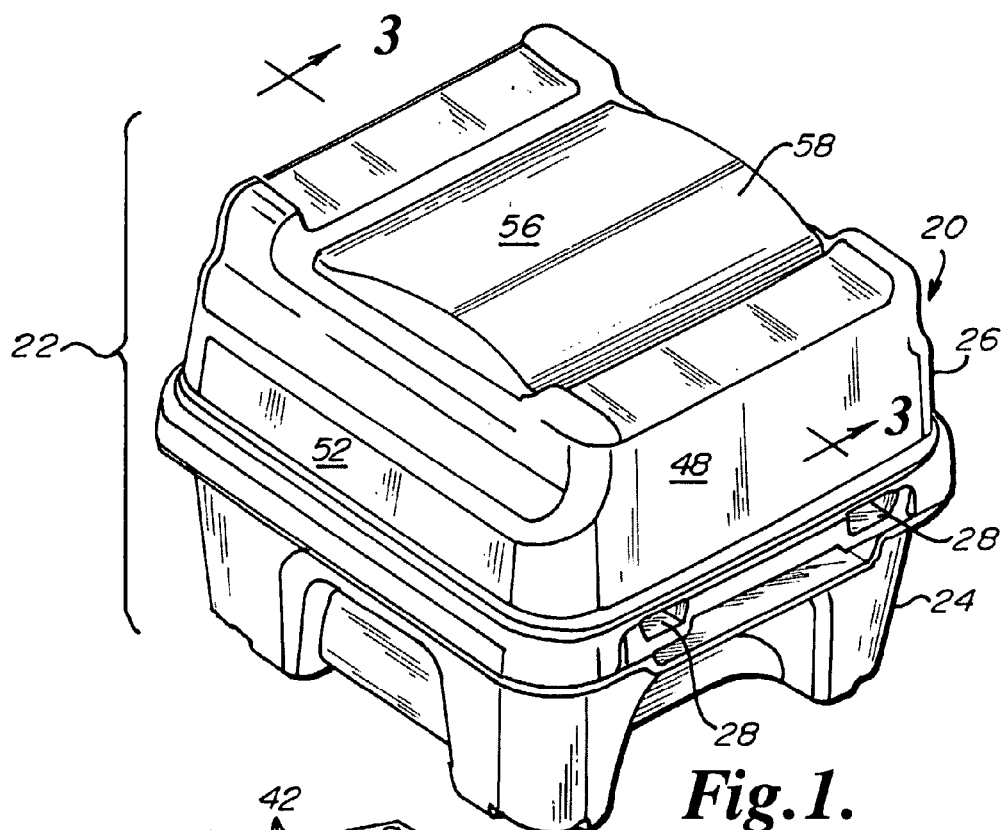
FIG. 1 is a perspective view of a wafer shipper according to an embodiment of the invention.

Wafer shipper 20 depicted in FIGS. 1-7 generally includes enclosure 22 having a base portion 24 and a cover portion 26 which is sealingly engagable therewith. One or more latch assemblies 28 may be included to secure cover portion 26 in place on base portion 24.

Figure 2:
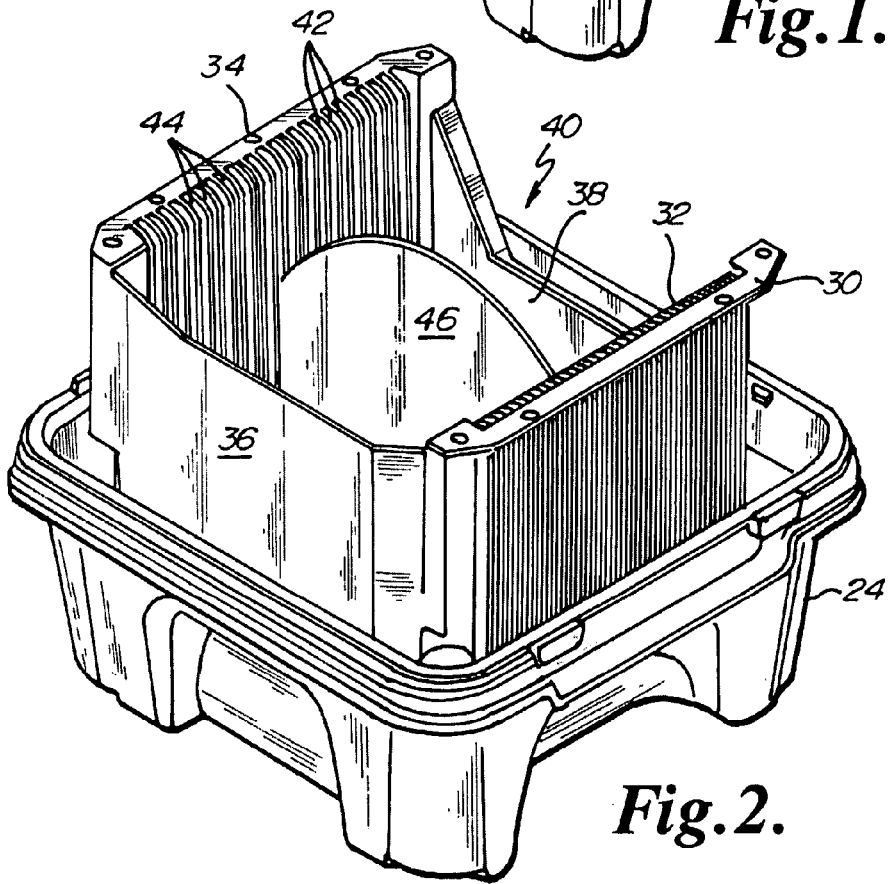
FIG. 2 is a perspective view of the base portion of the wafer shipper of FIG. 1, depicting a cassette in the shipper with a wafer received in one of the slots of the cassette.

In FIG. 2 there is depicted base portion 24 having wafer cassette 30 received therein. Wafer cassette 30 generally includes sidewalls 32, 34, joined by a pair of end walls 36, 38.

Cassette 30 typically has an open top 40 and an open bottom (not depicted). Sidewalls 32, 34, each generally include a plurality of projecting parallel ribs 42, defining a plurality of channels 44 therebetween. Channels 44 of sidewall 32 are in registry with channels 44 of sidewall 34 so as to define a plurality of slots, each for receiving a disk shaped wafer 46, and holding the wafers 46 in a generally parallel spaced apart array. Further general details of enclosure 22 and cassette 30 are described in U.S. Pat. No. 5,992,638, hereby fully incorporated herein by reference.

Figure 3:
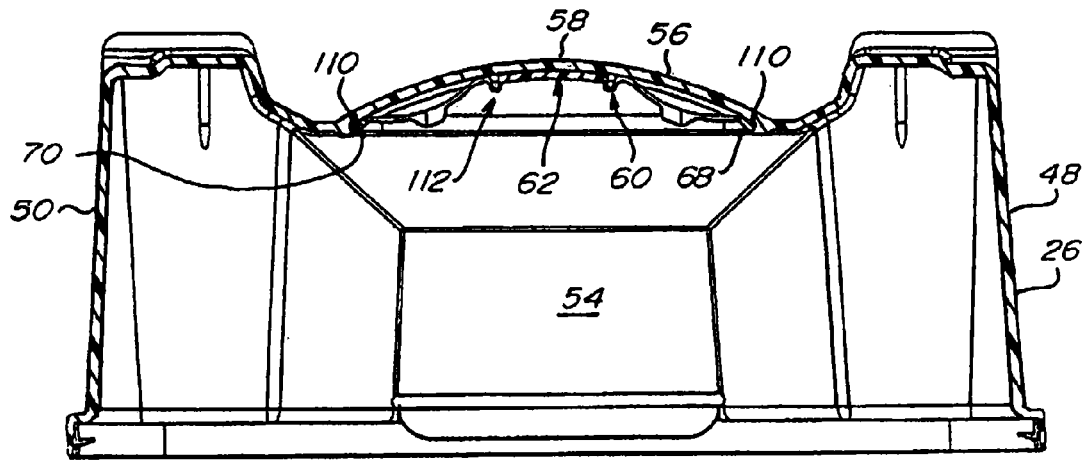
FIG. 3 is cross section of the cover portion of the wafer shipper of FIG. 1, taken at section 3-3 of FIG. 1.

Cover portion 26 as depicted in FIGS. 1 and 3 generally includes a pair of parallel side walls 48, 50, end walls 52, 54, and a top wall 56. Top wall 56 has central arcuate portion 58 defining recess 60 for receiving cushion 62.

As depicted in FIGS. 4 and 5-7, cushion 62 generally includes mounting structure 64 and a plurality of wafer receiving structures 66. Mounting structure 66 in the embodiment depicted in FIG. 4, generally includes end members 68, 70, and center member 72. Snap-on connector member 74 extends from center member 72, and generally includes intermediate portion 76 and tab 78.

Figure 4:
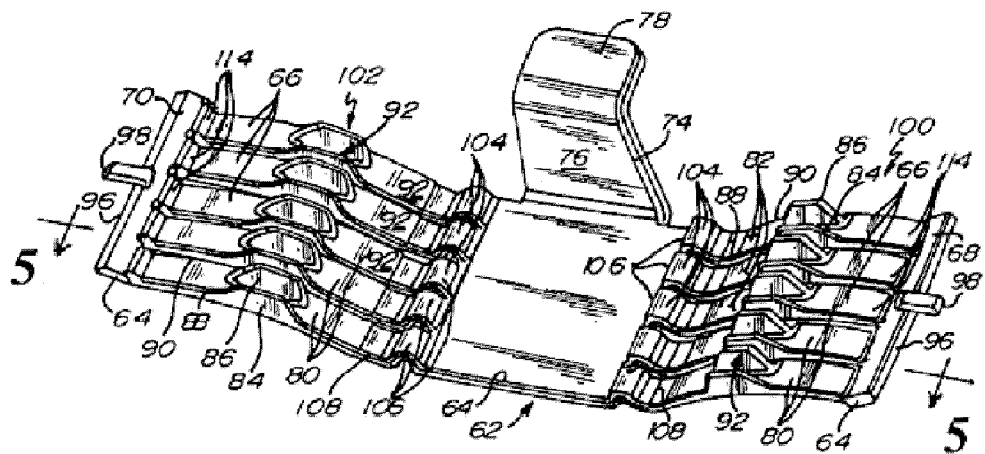
FIG. 4 is a perspective view of a cushion according to an embodiment of the invention.
Figure 5:
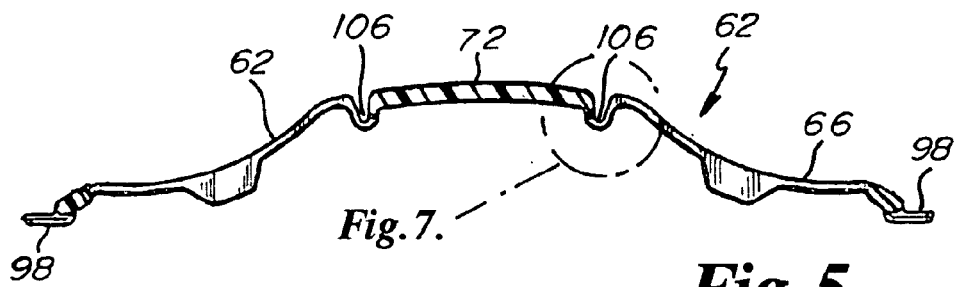
FIG. 5 is a cross-section of the cushion of FIG. 4, taken at section 5-5 of FIG. 4.
Figure 6:
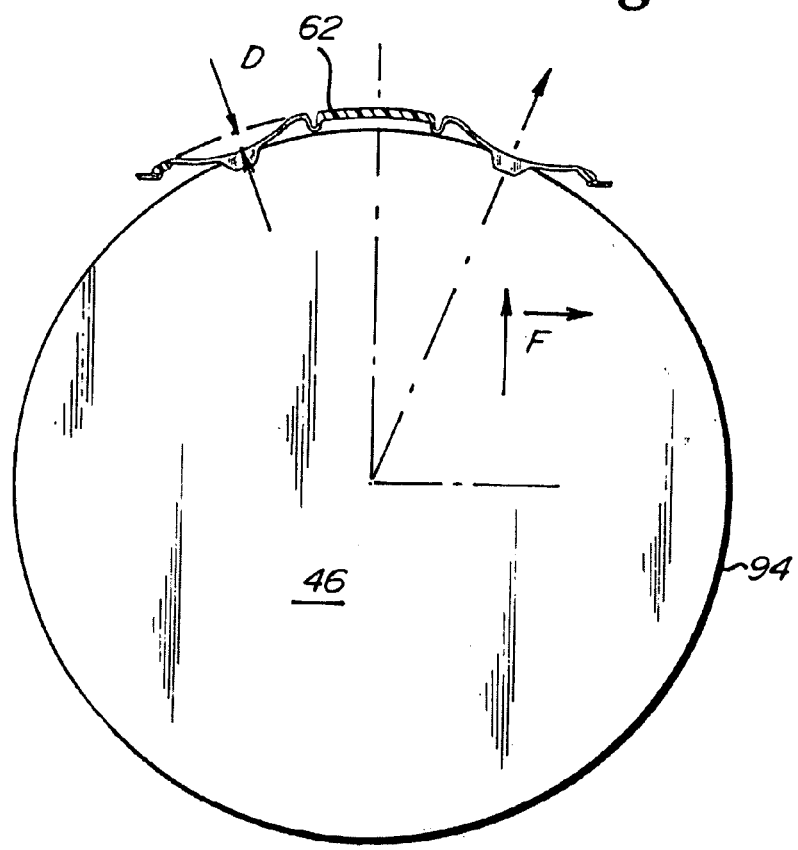
FIG. 6 is an end view of the cushion of FIG. 4, depicting engagement of the cushion with a wafer.

Each wafer receiving structure 66 generally includes convex body portion 80, presenting an outer surface 82. A pair of spaced apart ribs 84, 86, projects from outer surface 82 proximate and along the edges 88, 90, of each wafer receiving structure 66, so as to define a channel 92 therebetween for receiving an edge 94 of wafer 46 as depicted in FIG. 6. As depicted in FIGS. 4-6, each wafer receiving structure 66 is pre-formed in a convex shape bowing outwardly relative to cushion 62, and is made from a suitably resilient material so as to form a leaf spring structure. As further described hereinbelow, wafer receiving structure 66 is thereby enabled to deflect, flattening the convex shape, when urged against edge 94 of wafer 46.

Figure 7:
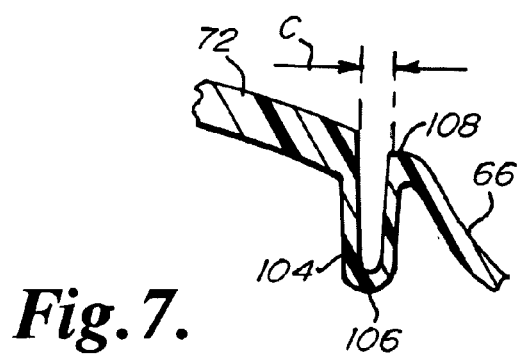
FIG. 7 is a fragmentary view of a portion of FIG. 6, depicted within the broken inset circle on FIG. 6.

Each end member 68, 70, generally includes elongate body portion 96 having one or more securing tabs 98 projecting laterally therefrom. In the embodiment depicted in FIGS. 4-6, a first plurality 100 of wafer receiving structures 66 extends between end member 68 and center member 72, and a second plurality 102 of wafer receiving structures 66 extends between end member 70 and center member 72, such that channels 92 of first plurality 100 are aligned with channels 92 of second plurality 102. According to an embodiment of the invention, a biasing element 104 in the form of a compression spring 106 operably couples inner end 108 of each wafer receiving structure 66 to center member 72. As depicted in FIG. 7, compression spring 106 may be configured a generally v-shaped or u-shaped discontinuity interposed between center member 72 and wafer receiving structure 66.

Cushion 62 is preferably integrally formed in a single piece of a resilient elastomer suitable for use in a high-purity wafer-container environment. Polymer materials suitable for cushion 62 include, for purposes of example, thermoplastic elastomers, such as urethane, polybutylene terephthalate, polyolefin, polyethylene terephthalate, styrenic block co-polymer, styrene-butadiene rubber, or polyether block polyamide. Conductive alloying agents such as, for example, carbon fiber may be combined with the polymer material for purposes of static dissipation. It will be appreciated by those of skill in the art that cushion 62 may also be formed from any other sufficiently resilient and durable material suitable for use in a high-purity wafer container environment.

As depicted in FIG. 3, cushion 62 is received in recess 60 of cover portion 26. End members 68, 70 abut facing walls 110 of recess 60. Securing tabs 98 are received in recesses (not depicted) defined in facing walls 110 to secure cushion 62 in position in recess 60. In embodiments of the invention, snap-on connector member 74 engages and snaps over end wall 112 of recess 60 to further secure cushion 62 in place.

In use, with wafers 46 received in cassette 30, which is in turn received in base portion 24, cover portion 26 is advanced downwardly into position. The edges 94 of wafers 46 are received in channels 92 of each wafer receiving structure 66 of the first 100 and second 102 plurality. As cover portion 26 is advanced further downward onto base portion 24, wafer receiving portions 66 are deflected toward cover portion 26 by force F exerted by wafer 46, thereby flattening their convex shape. As wafer receiving portions 66 are flattened, outer ends 114 are constrained from lateral translation by the abutting contact of end members 68, 70, with facing walls 110 of recess 60. Inner ends 108, however, translate toward center member 72 against the bias of biasing element 104, thereby enabling each of the wafer receiving portions 66 to extend laterally. As depicted in FIGS. 6 and 7, the amount of lateral compression C of compression spring 106 and the depth D of the convex shape of wafer receiving structure 66 defines the amount of lateral extension enabled for wafer receiving portions 66. The dimensions of compression C and depth D are determined according to the material properties of cushion 62 and the relative geometries of the wafer and various parts of the cushion.

Figure 4A:
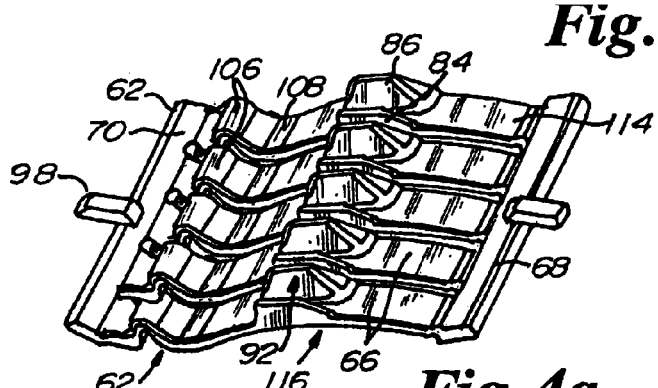
FIG. 4A is a perspective view of an alternative embodiment of a cushion according to an embodiment of the invention.

In an alternative embodiment depicted in FIG. 4a, cushion 62 may include a single plurality 116 of wafer receiving members 66 extending between end members 68, 70. In this embodiment, springs 106 are interposed between each wafer receiving member 66 and one or the other of end members 68, 70. In use, the wafer receiving members 66 and cushion of this embodiment function substantially as described above.

Figure 8:
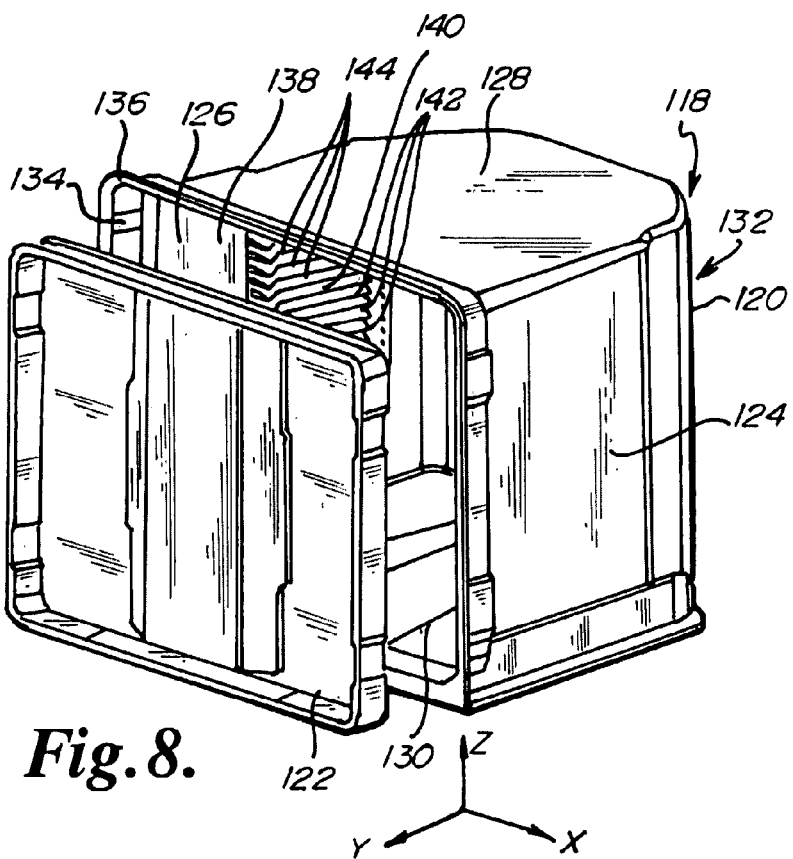
FIG. 8 is a perspective view of a substrate container according to another embodiment of the invention.
Figure 10:
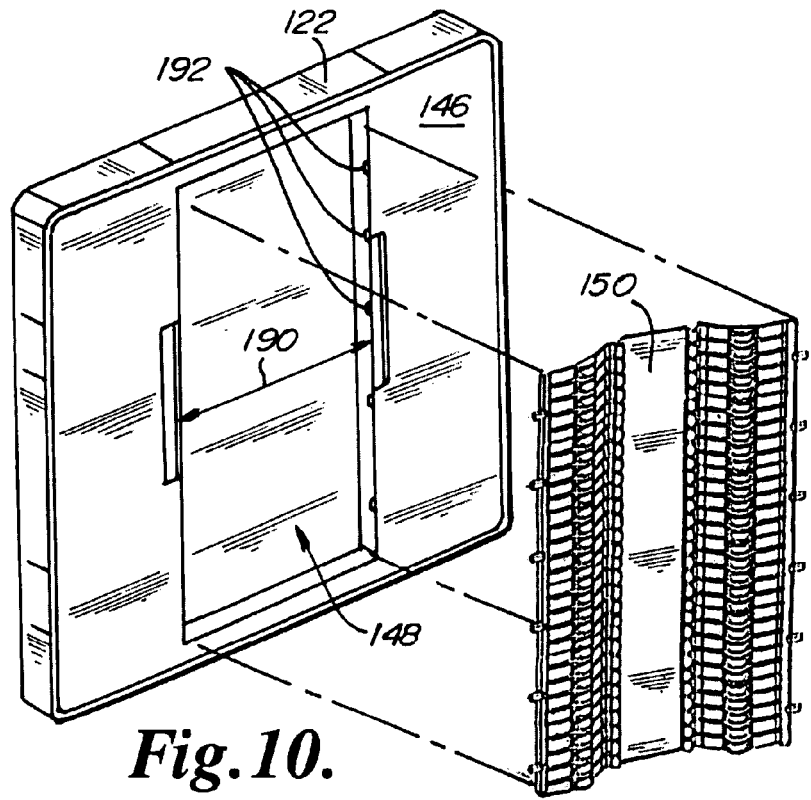
FIG. 10 is an exploded view of the door and cushion assembly of the container of FIG. 8.
Figure 9:
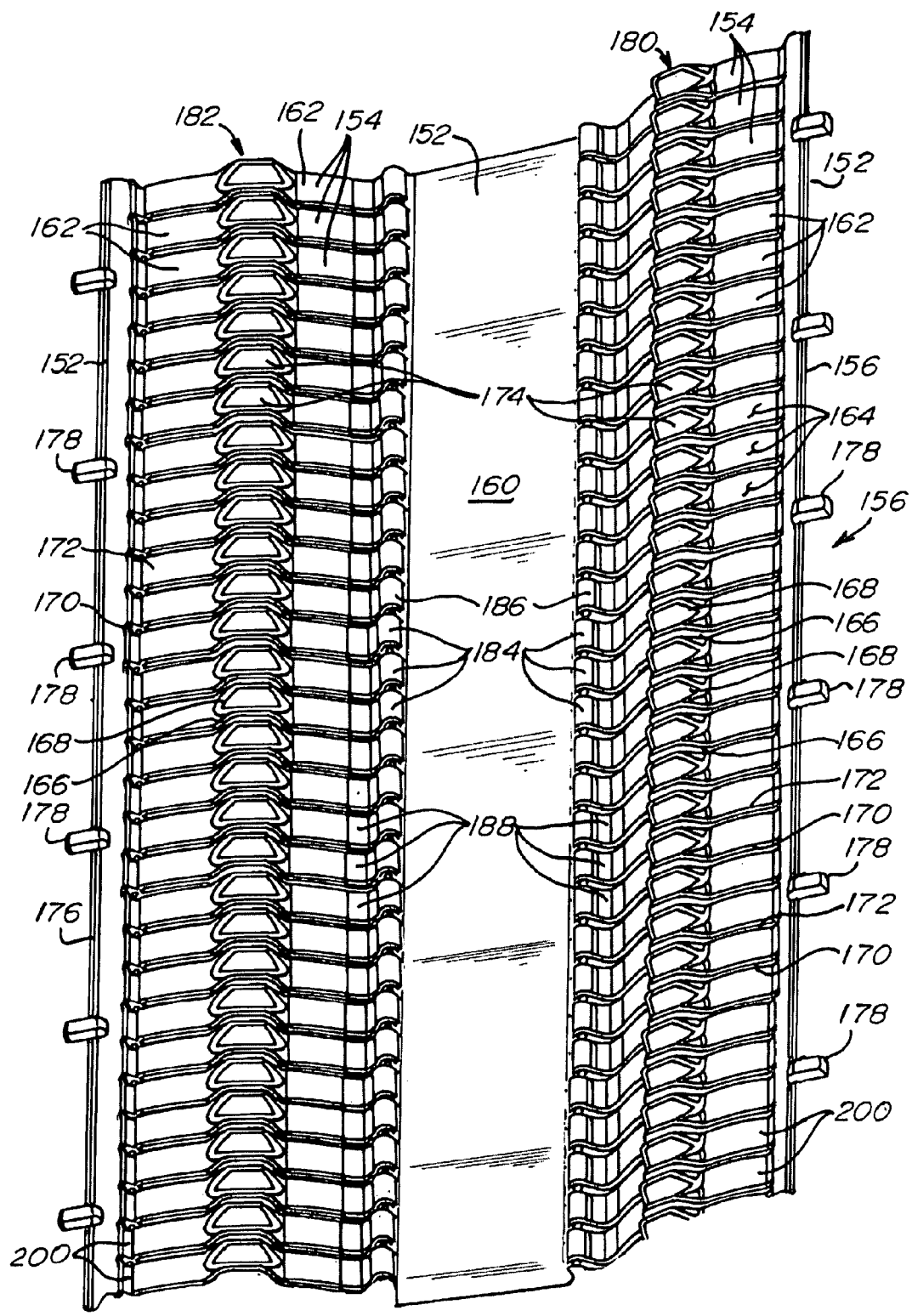
FIG. 9 is a perspective view of the cushion of the container of FIG. 8.

A substrate container 118 according to another embodiment of the invention is depicted in FIGS. 8-10. Container 118 generally includes an enclosure portion 120 and a door 122. Enclosure portion 120 generally includes a pair of side walls 124, 126, a top wall 128, a bottom wall 130, a back 132, and an open front 134 defined by a door frame 136. Enclosure portion 120 defines interior space 138 containing a pair of spaced apart substrate or wafer supports 140. Each support 140 has a plurality of projecting parallel ribs 142, defining a plurality of channels 144 therebetween. Channels 144 of each of support 140 are in registry with the channels 144 of the opposite support 140 so as to define a plurality of slots, each for receiving a substrate and holding the substrates in a generally parallel spaced apart array. Further general details of enclosure portion 120 and door 122 are disclosed in U.S. Pat. No. 6,267,245, hereby fully incorporated herein by reference.

Door 122 as depicted in FIG. 10 generally includes an inner wall 146 defining a recess 148 for receiving cushion 150. Cushion 150 as depicted in FIG. 9, generally includes mounting structure 152 and a plurality of wafer receiving structures 154. Mounting structure 152 in the embodiment depicted in FIG. 9, generally includes end members 156, 158, and center member 160.

Each wafer receiving structure 154 generally includes convex body portion 162, presenting an outer surface 164. A pair of spaced apart ribs 166, 168, projects from outer surface 164 proximate and along the edges 170, 172, of each wafer receiving structure 154, so as to define a channel 174 therebetween for receiving an edge 94 of wafer or substrate 46. As depicted in FIG. 9, each wafer receiving structure 154 is pre-formed in a convex shape bowing outwardly relative to cushion 150, and is made from a suitably resilient material so as to form a leaf spring structure. As further described hereinbelow, wafer receiving structure 154 is thereby enabled to deflect, flattening the convex shape, when urged against edge 94 of wafer or substrate 46.

Each end member 156, 158, generally includes elongate body portion 176 having one or more securing tabs 178 projecting laterally therefrom. A first plurality 180 of wafer receiving structures 154 extends between end member 156 and center member 160, and a second plurality 182 of wafer receiving structures 154 extends between end member 158 and center member 160, such that channels 174 of first plurality 180 are aligned with channels 174 of second plurality 182. According to an embodiment of the invention, a biasing element 184 in the form of a compression spring 186 operably couples inner end 188 of each wafer receiving structure 154 to center member 160. Compression spring 186 may be configured a generally v-shaped or u-shaped discontinuity interposed between center member 160 and wafer receiving structure 154.

Cushion 150 is preferably integrally formed in a single piece of a resilient elastomer suitable for use in a high-purity wafer-container environment. Polymer materials suitable for cushion 150 include, for purposes of example, thermoplastic elastomers, such as urethane, polybutylene terephthalate, polyolefin, polyethylene terephthalate, styrenic block co-polymer, styrene-butadiene rubber, or polyether block polyamide. Conductive alloying agents such as, for example, carbon fiber may be combined with the polymer material for purposes of static dissipation. It will be appreciated by those of skill in the art that cushion 150 may also be formed from any other sufficiently resilient and durable material suitable for use in a high-purity wafer container environment.

As depicted in FIG. 10, cushion 150 is received in recess 148 of door 122. End members 156, 158, abut facing walls 190 of recess 148. Securing tabs 178 are received in recesses 192 defined in facing walls 190 to secure cushion 150 in position in recess 148.

In use, with substrates 46 received in supports 140, door 122 is advanced into position in door frame 136. The edges 94 of wafers 46 are received in channels 174 of each wafer receiving structure 154 of the first 180 and second 182 plurality. As door 122 is advanced further into door frame 136, wafer receiving portions 154 are deflected toward door 122 by substrates 46, thereby flattening their convex shape. As wafer receiving portions 154 are flattened, outer ends 200 are constrained from lateral translation by the abutting contact of end members 156, 158, with facing walls 190 of recess 148. Inner ends 188, however, translate toward center member 160 against the bias of biasing element 184, thereby enabling each of the wafer receiving portions 154 to extend laterally.

Although the present invention has been described with reference to preferred embodiments, those skilled in the art will recognize that changes may be made in form and detail without departing from the spirit and scope of the invention.

What is claimed is:

1. A container for holding a plurality of semiconductor wafers comprising:
    a cassette defining a plurality of slots, each slot for receiving a separate one of the semiconductor wafers;
    an enclosure adapted to receive the cassette and wafers therein, the enclosure comprising a base portion and a cover portion sealably securable to the base portion defining an interior, the cover portion comprising an upper wall including an inwardly facing surface, the inwardly facing surface including an inner arcuate and concave surface facing towards the base when assembled; and
    a cushion comprising a mounting structure including a pair of spaced apart end members attached to the cover portion and a center member having an arcuate surface that contacts and follows the inner arcuate and concave surface of the upper wall but is not otherwise constrained by the cover portion, the spaced apart end members attached to the inwardly facing surface of the top cover, each end member having a plurality of elongate resilient wafer receiving structures extending from the respective end member toward the the center member, the plurality of elongate resilient wafer receiving structures being convex relative to the wafer received and the base, each wafer receiving structure having a pair of opposing ends and a pair of spaced apart lips intermediate the ends, the lips defining a channel for receiving an edge of one of the plurality of wafers, a plurality of V-shaped or U-shaped springs positioned between and connecting to each elongate resilient wafer receiving structure and to the center member, each V-shaped or U-shaped spring having a convex portion facing the base portion when assembled, whereby when the container is assembled and loaded with wafers the convex portion is engageable with a respective wafer and each elongate resilient wafer receiving structure is deflected inwardly toward the cover portion.

2. The wafer container of claim 1, wherein the cover portion defines a recess facing inwardly toward the base portion, and wherein the cushion is received in the recess.

3. The wafer container of claim 2, wherein the recess is defined between a pair of spaced apart opposing walls of the cover portion, and wherein each of the end members of the mounting structure abut a separate one of the spaced apart opposing walls.

4. The wafer container of claim 1, wherein a first plurality of the wafer receiving structures extending between one of the end members and the center member and a second plurality of the wafer receiving structures extending between the other one of the end members and the center member such that each one of the first plurality of wafer receiving structures is in lateral registry with a separate one of the second plurality of wafer receiving structures.

5. The wafer container of claim 4, wherein the generally v-shaped or u-shaped compression springs of the first plurality of wafer receiving structures and the generally V-shaped or U-shaped springs of the second plurality of wafer receiving structures are in engagement with the arcuate and concave surface of the upper wall of the top cover.

6. The wafer container of claim 4, wherein at least one snap-on connector tab for securing the cushion to the cover portion extends from the center member.

7. A container for holding a plurality of semiconductor wafers comprising:
    a cassette defining a plurality of slots, each slot for receiving a separate one of the semiconductor wafers;
    an enclosure adapted to receive the cassette and wafers therein, the enclosure comprising a base portion and a top cover portion sealably securable to the base portion, the cover portion including a centrally extending recess with an arcuate shape in cross section;and
    a cushion comprising a mounting structure including a pair of spaced apart end members and a center member, the spaced apart end members attached to the cover portion in the centrally extending recess, and the center member having an arcuate surface in contact with an interior facing arcuate wall of the enclosure and not being otherwise constrained by the cover portion and the cushion further comprising a plurality of convex shaped elongate resilient wafer receiving structures each of the plurality of convex shaped elongate resilient wafer receiving structures extending between the center member and one of the end members and the plurality of convex shaped elongate resilient wafer receiving structures being convex relative to the received wafer, each wafer receiving structure having a pair of opposing ends and a pair of spaced apart lips intermediate the ends, the lips defining a channel for receiving an edge of one of the plurality of wafers, wherein the cushion is received on the cover portion of the enclosure and is positioned such that when the wafers are received in the cassette, the cassette is received in the base portion of the enclosure, and the cover is received on the base, the channels of the cushion are in registry with the slots of the cassette and the edge of each wafer in the cassette engages and deflects a separate one of the convex shaped elongate wafer receiving structures inwardly toward the cover portion, each of the wafer receiving structures further comprising generally u-shaped compression portion coupled to the center member, and being convex with respect to the base portion, for enabling lateral extension of each wafer receiving structure when the convex shaped elongate wafer receiving structure is compressed toward the cover portion.

8. The wafer container of claim 7, wherein each U-shaped compression portion is engageable with one of the wafers when container is loaded with wafers.

9. The wafer container of claim 7, wherein the cover portion defintes the recess facing inwardly toward the base portion, and wherein the cushion is received in the recess.

10. The wafer container of claim 1, wherein at least one snap-on connector tab for securing the cushion to the cover portion extends from the center member.

11. A container for a holding a plurality of semiconductor wafers comprising:

an enclosure adapted to receive the wafers therein, the enclosure comprising a pair of opposing side walls, a top, a bottom, a back, an open front and a door for sealingly closing the open front, the door having a centrally extending vertical recess defined by a pair of spaced apart and opposing recess side walls, the enclosure further comprising a plurality of wafer shelves defining a plurality of slots, each for receiving a separate one of the wafers; and a cushion comprising a mounting structure including a pair of spaced apart end members and a center member, the spaced apart end members attached to the recess side walls and the center member extending along and being in contact with but not attached to and not otherwise constrained by an interior facing planar wall of the enclosure and the cushion further comprising a plurality of convex shaped elongate resilient wafer receiving structures extending between the center member and one of the end members and the plurality of convex shaped elongate resilient wafer receiving structures being convex relative to the received wafer, each wafer receiving structure having a pair of opposing ends and a pair of spaced apart lips intermediate the ends, the lips defining a channel for receiving an edge of one of the plurality of wafers, wherein the cushion is received on the door and is positioned such that when the wafers are received in the slots and the door closes the open front, the channels of the cushion are in registry with the slots and the edge of each wafer in the slots engages and deflects a separate one of the convex wafer receiving structures inwardly toward the door, each of the wafer receiving structures further comprising generally v-shaped or u-shaped compression spring operably coupling to the center member, such that as the convex shaped elongate wafer receiving structure is deflected inwardly toward the door, the generally v-shaped or u-shaped compression spring is compressed to thereby enable lateral extension of the convex shaped elongate wafer receiving structure.

12. The wafer container of claim 11, wherein the door defines the recess facing inwardly into the enclosure, and wherein the cushion is received in the recess.

13. The wafer container of claim 12, wherein each of the end members of the mounting structure abut a separate one of the spaced apart recess side walls.

14. The container of claim 11, wherein each u-shaped or v-shaped compression spring is engageable with one of the wafers when container is loaded with wafers.

\* \* \* \* \*

UNITED STATES PATENT AND TRADEMARK OFFICE
CERTIFICATE OF CORRECTION

PATENT NO. : 8,528,738 B2
APPLICATION NO. : 12/303789
DATED : September 10, 2013
INVENTOR(S) : Brian Wiseman It is certified that error appears in the above-identified patent and that said Letters Patent is hereby corrected as shown below:

In the Specification
Column 2, Line 3, delete "pluralit" and insert --plurality--, therefor In the Claims
Column 8, Claim 5, Line 39, delete "v" and insert --V--, therefor
Column 8, Claim 5, Line 39, delete "u" and insert --U--, therefor
Column 8, Claim 7, Line 55, delete "section;and" and insert --section; and--, therefor
Column 9, Claim 7, Line 16, delete "u" and insert --U--, therefor
Column 9, Claim 7, Line 16, delete "compression portion" and insert --compression spring--, therefor
Column 9, Claim 8, Line 23, delete "compression portion" and insert --compression spring--, therefor
Column 9, Claim 9, Line 26, delete "defintes" and insert --defines--, therefor
Column 9, Claim 10, Line 28, delete "1" and insert --7--, therefor
Column 9, Claim 11, Line 31, after "for" delete "a", therefor
Column 10, Claim 11, Line 24, delete "v" and insert --V--, therefor
Column 10, Claim 11, Line 24, delete "u" and insert --V--, therefor
Column 10, Claim 11, Line 27, delete "v" and insert --V--, therefor
Column 10, Claim 11, Line 28, delete "u" and insert --U--, therefor
Column 10, Claim 14, Line 37, delete "u" and insert --U--, therefor
Column 10, Claim 14, Line 38, delete "v" and insert --V--, therefor Signed and Sealed this
Third Day of March, 2015

Michelle K. Lee
*Deputy Director of the United States Patent and Trademark Office*